United States Patent
Pirk et al.

(10) Patent No.: US 9,829,357 B2
(45) Date of Patent: Nov. 28, 2017

(54) MICROELECTROMECHANICAL SENSOR MODULE AND CORRESPONDING PRODUCTION METHOD

(75) Inventors: Tjalf Pirk, Stuttgart (DE); Thomas Wagner, Leonberg (DE); Ando Feyh, Palo Alto, CA (US); Georg Bischopink, Pliezhausen (DE); Axel Franke, Ditzingen (DE)

(73) Assignee: Robert Bosch GmbH, Stuttgart (DE)

( * ) Notice: Subject to any disclaimer, the term of this patent is extended or adjusted under 35 U.S.C. 154(b) by 952 days.

(21) Appl. No.: 13/992,136

(22) PCT Filed: Oct. 14, 2011

(86) PCT No.: PCT/EP2011/068003
§ 371 (c)(1),
(2), (4) Date: Aug. 24, 2013

(87) PCT Pub. No.: WO2012/076223
PCT Pub. Date: Jun. 14, 2012

(65) Prior Publication Data
US 2013/0327163 A1    Dec. 12, 2013

(30) Foreign Application Priority Data
Dec. 7, 2010 (DE) .................. 10 2010 062 559

(51) Int. Cl.
*G01D 21/02* (2006.01)
*G01C 19/5783* (2012.01)
(Continued)

(52) U.S. Cl.
CPC ......... *G01D 21/02* (2013.01); *G01C 19/5783* (2013.01); *H01L 25/0657* (2013.01);
(Continued)

(58) Field of Classification Search
CPC ............... G01C 19/5783; G01D 21/02; H01L 2224/16145; H01L 2224/48145;
(Continued)

(56) References Cited

U.S. PATENT DOCUMENTS

2006/0220210 A1  10/2006  Karnezos et al.
2010/0019370 A1*  1/2010  Pressel ............ B81B 7/02
                                    257/690

(Continued)

FOREIGN PATENT DOCUMENTS

DE    10 2004 011 159 A1    4/2005
DE    10 2004 011 129 A1    8/2005
(Continued)

OTHER PUBLICATIONS

International Search Report corresponding to PCT Application No. PCT/EP2011/068003, dated Jul. 18, 2012 (German and English language document) (9 pages).

*Primary Examiner* — Daniel S Larkin
(74) *Attorney, Agent, or Firm* — Maginot, Moore & Beck LLP

(57) ABSTRACT

A microelectromechanical sensor module includes a sensing mechanism for measuring an acceleration, pressure, air humidity or the like, a control mechanism for controlling the sensing mechanism, an energy supply mechanism for supplying the sensor module with energy, and a transmission mechanism for transmitting signals of the sensing mechanism. At least three of the mechanisms are integrated at the chip level in at least one chip in each case. A corresponding method is implemented to produce the microelectromechanical sensor module.

10 Claims, 3 Drawing Sheets

(51) Int. Cl.
*H01L 25/065* (2006.01)
*G01P 1/02* (2006.01)

(52) U.S. Cl.
CPC .... *G01P 1/023* (2013.01); *H01L 2224/16145* (2013.01); *H01L 2224/16245* (2013.01); *H01L 2224/48145* (2013.01); *H01L 2224/48245* (2013.01); *H01L 2224/48247* (2013.01); *H01L 2224/73257* (2013.01); *H01L 2225/06506* (2013.01); *H01L 2225/06513* (2013.01); *Y10T 29/49128* (2015.01)

(58) Field of Classification Search
CPC . H01L 2224/48247; H01L 2224/73257; H01L 2225/06506; H01L 2225/06513; H01L 25/0657; H01L 2224/16245; H01L 2224/48245; Y10T 29/49128; G01P 1/023
See application file for complete search history.

(56) References Cited

U.S. PATENT DOCUMENTS

| | | | |
|---|---|---|---|
| 2010/0127937 A1* | 5/2010 | Chandrasekaran | G06K 19/07775 343/700 MS |
| 2010/0201393 A1* | 8/2010 | Quercia | G06K 19/077 324/750.3 |
| 2013/0009851 A1* | 1/2013 | Danesh | H01G 9/20 343/904 |

FOREIGN PATENT DOCUMENTS

| | | |
|---|---|---|
| DE | 10 2005 041 452 A1 | 3/2007 |
| DE | 10 2005 041 539 B4 | 4/2008 |
| GB | 2 436 220 A | 9/2007 |
| JP | 2006-333328 A | 12/2006 |
| WO | 2010/136919 A1 | 12/2010 |

* cited by examiner

MICROELECTROMECHANICAL SENSOR MODULE AND CORRESPONDING PRODUCTION METHOD

This application is a 35 U.S.C. §371 National Stage Application of PCT/EP2011/068003, filed on Oct. 14, 2011, which claims the benefit of priority to Serial No. DE 10 2010 062 559.0, filed on Dec. 7, 2010 in Germany, the disclosures of which are incorporated herein by reference in their entirety.

BACKGROUND

The disclosure relates to a microelectromechanical sensor module and a corresponding method for producing a microelectromechanical sensor module.

Microelectromechanical sensor modules are used for numerous applications, for example for measuring accelerations, angular rates, magnetic fields, temperature, pressure or the like.

One field of use of such microelectromechanical sensors, for example in the case of angular rate sensors, is automobiles, in which these sensors are used as part of the electronic stability program (ESP) in order to match a yaw rate of the automobile to angular rates of different wheels of the automobile.

DE 10 2005 041 539 B4 discloses connecting sensing means and an application specific integrated circuit at the wafer level. FIG. 6 shows a connection of this type: a first chip 3, which contains a sensing means 3a, is arranged on a printed circuit board 2. On this chip is arranged a further chip 4 comprising an application specific integrated circuit 4a. Vias 10a enable the connection between the chip 4 and the chip 3, whereas wire bonds 10b are used to connect the chip 3 to the printed circuit board 2 in order to make electrical contact.

SUMMARY

According to the disclosure, a microelectromechanical sensor module includes sensing means for measuring an acceleration, pressure, air humidity or the like, a control means for controlling the sensing means, power supply means for supplying power to the sensor module, and transmission means for transmitting signals from the sensing means, wherein at least three of the means are integrated at the chip level, each in a chip.

According to the disclosure, a method for producing a microelectromechanical sensor module includes the steps,
arranging sensing means for measuring an acceleration, pressure, air humidity or the like,
arranging a control means for controlling the sensing means,
arranging power supply means for supplying power to the sensor module, and
arranging transmission means for transmitting signals from the sensing means,
wherein at least three of the means are arranged such that they are integrated at the chip level, each in a chip.

One of the achieved advantages is that of enabling a greater integration density. A further advantage is that this facilitates smaller constructions, and thereby makes it easier to convert or upgrade and also to retrofit existing installations/buildings or even objects with electronic open-loop and closed-loop control by means of the microelectromechanical sensor module. In all, it also enables cheaper fabrication.

Of course the respective means can be arranged on the respective chips for optimum use of space to minimize the volume of the respective chip. Furthermore, the chips can also be arranged with respect to one another so as to minimize the installation space of the sensor module. The chips can be arranged here side by side and/or one above the other.

The subclaims describe further advantageous embodiments and features of the disclosure.

According to an advantageous development of the disclosure, all the means are integrated at the chip level, each in a chip. This enables a sensor module that is both autonomous and fully integrated at the chip level, i.e. the sensor module does not depend on an external power supply and has a high integration density combined with a small construction.

According to a further advantageous development of the disclosure, the power supply means comprise a battery, in particular a thin-film battery, and/or an environment energy converter, in particular a solar cell. This achieves the advantage of enabling a fully autonomous microelectromechanical sensor module. The environment energy converter enables recharging of the battery, which is used to supply power to the microelectromechanical sensor module. This increases the autonomous operating life of the microelectromechanical sensor module.

According to a further advantageous development of the disclosure, the transmission means comprise a radio frequency interface and/or an antenna. This achieves the advantage of being able to dispense with costly wiring of the microelectromechanical sensor module and enabling simple integration or retrofitting in existing applications.

According to a further advantageous development of the disclosure, at least two of the means are arranged on a common chip, in particular two of the means on each chip. This enables even greater integration and hence an even smaller construction of the microelectromechanical sensor module.

According to a further advantageous development of the disclosure, vias are arranged for making contact between the chips and/or between the chips and a printed circuit board. This achieves the advantage that the contact-making elements can also be integrated into individual chips, which increases the integration density even further. At the same time, vias are also less prone to environmental influences than wire bonds. This increases the operating life of the micro-electromechanical sensor module.

According to a further advantageous development of the disclosure, the vias are arranged at the edge of the respective chip and/or at least some of the vias are designed as an antenna. This achieves the advantage of increasing the integration density even further, because the antenna structure can be realized by means of vias arranged at the chip edge. In addition, it is also possible to implement the antennas as fractal antennas or even antennas made of metamaterials.

According to a further advantageous development of the disclosure, the solar cell comprises a collector interconnection system, and the collector interconnection system is designed as transmission means, in particular as an antenna. This enables a particularly advantageous combination of the solar cell and the antenna. Since a solar cell normally requires a collector interconnection system, also known as a busbar, on its outside, this interconnection system can also be used as an antenna simultaneously or even partially, for example by dividing the period of use into different time segments. This increases the integration density even further and makes the installation space of the microelectromechanical sensor module even smaller.

BRIEF DESCRIPTION OF THE DRAWINGS

Further features and advantages of the disclosure are explained in greater detail in the following description and are shown in the drawing, in which.

DETAILED DESCRIPTION

Figure 1:
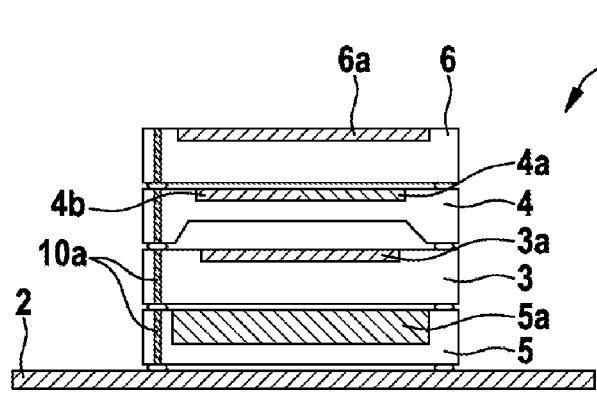
FIG. 1 shows in cross-section a microelectro-mechanical sensor module according to a first embodiment of the present disclosure.

In FIG. 1, reference sign 1 denotes a microelectromechanical sensor module in cross-section, which is arranged on a printed circuit board 2. The microelectromechanical sensor module 1 comprises a first chip 5, which comprises a three-dimensional thin-film battery 5a. The chip 5 is arranged directly on the printed circuit board 2 and connected to same by means of a via 10a, which is arranged on the left-hand side of the chip 3. On the first chip 5 is arranged a further chip 3, which contains sensing means 3a for measuring an acceleration. These sensing means are connected to the underlying chip 5 by means of vias 10a on the left-hand side of the chip 3. On the chip 3 is arranged a further chip 4. The chip 4 comprises an application specific integrated circuit 4b and transmission means 4a in the form of a radio frequency interface. The chip 4 is connected on its left-hand side to the chip 3 and further to the chip 5 and the printed circuit board 2 by means of a via 10a. A further chip 6 comprising a solar cell 6a is arranged on the chip 4. On the left-hand side of the microelectromechanical sensor module 1 shown in cross-section are arranged vias 10a, which connect the chip 6 to the chip 4 and further to the chip 3, the chip 5 and finally the printed circuit board 2. FIG. 1 shows an autonomous microelectromechanical sensor module 1 that is fully integrated at the chip level and contains discrete chips 3, 4, 5, 6 for the individual functions. It is possible here to implement the radio frequency interface 4a, or radio interface, as part of the application specific integrated circuit 4b.

Figure 2:
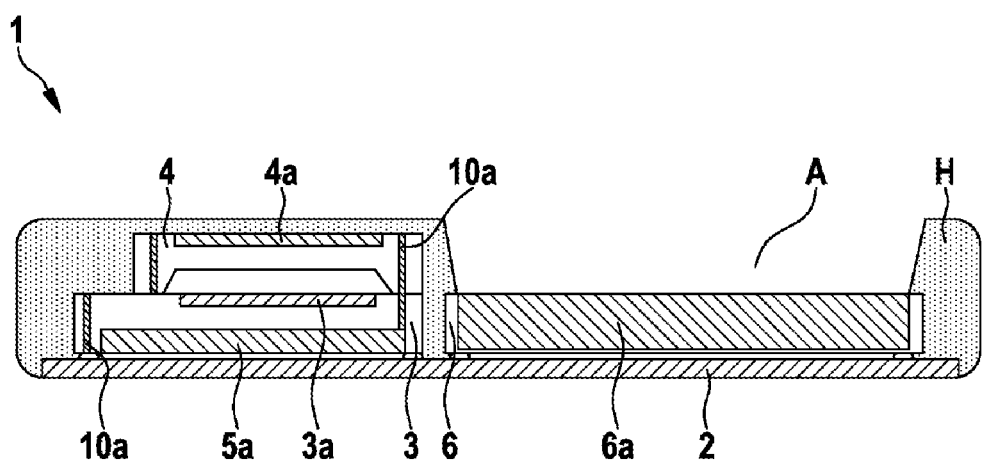
FIG. 2 shows in cross-section a microelectro-mechanical sensor module according to a second embodiment of the present disclosure.

FIG. 2 shows in cross-section a microelectromechanical sensor module according to a second embodiment of the present disclosure. In FIG. 2, reference sign 1 again denotes a microelectromechanical sensor module. The sensor module 1 comprises a printed circuit board 2, which is arranged in a housing H. The printed circuit board 2 comprises on its left-hand upper face a chip 3, which comprises a three-dimensional thin-film battery 5a on its lower face, and on its upper face comprises sensing means 3a for measuring an acceleration. The chip 3 is electrically connected to the printed circuit board 2 by means of vias 10a on the left-hand side of said chip 3. On the right-hand side of the chip 3 is arranged a further via 10a, which is connected to a further chip 4 arranged on said chip 3. The chip 4 comprises an application specific integrated circuit 4a. On its left-hand side, the chip 4 is likewise connected to the chip 3 by means of vias 10a. The chip 3 and the chip 5 are here arranged entirely inside the housing H. A further chip 6 having a solar cell 6a is arranged on the right-hand side of the chip 3. The chip 6 is likewise arranged on the printed circuit board 2. The housing H has a suitable opening A above the solar cell 6a in order that the solar cell 6a of the chip 6 can receive light, which the solar cell 6a converts into electrical energy. Overall, the embodiment of FIG. 2 enables even greater chip-level integration. The microelectromechanical sensor module 1 shown in FIG. 2 can be used, for example, as a photovoltaic energy converter or electromagnetic radiation energy converter, as an antenna for radio transmission, as a battery etc.

Figure 3:
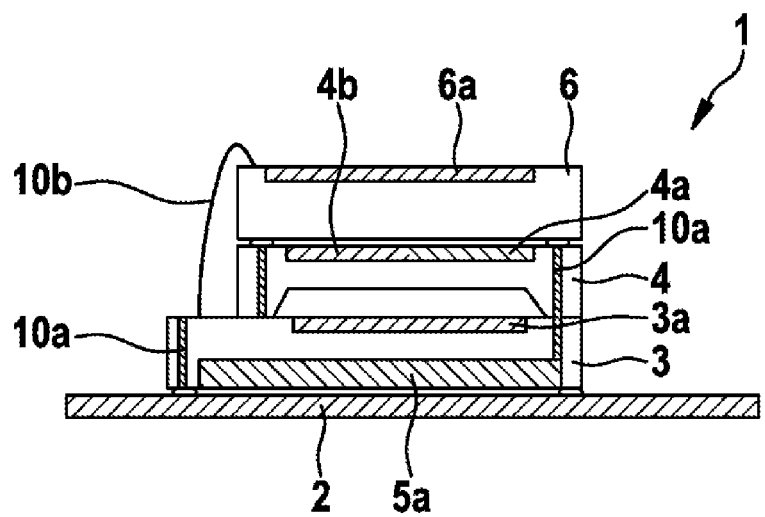
FIG. 3 shows in cross-section a microelectro-mechanical sensor module according to a third embodiment of the present disclosure.

FIG. 3 shows in cross-section a microelectromechanical sensor module according to a third embodiment of the present disclosure. In FIG. 3, reference sign 1 again denotes a microelectromechanical sensor module. The microelectromechanical sensor module 1 of FIG. 3 is constructed from the bottom upwards as follows: a chip 3 is arranged on a printed circuit board 2. The chip 3 is connected by means of vias 10a on its left-hand side to the printed circuit board 2 and by means of further vias on the right-hand side to a chip 4, which is arranged on the chip 3. The chip 3 here comprises sensing means 3a for measuring a pressure, and a thin-film battery 5a. The chip 4 here comprises an application specific integrated circuit 4b and a wireless radio interface 4a. Chip 4 is connected by means of vias 10a on its right-hand side to the chip 3, more precisely to the thin-film battery 5a, and likewise by means of further vias 10a on its left-hand side to the chip 3. A further chip 6, which comprises a solar cell 6a, is arranged on the chip 4. The solar cell 6a is here connected to the chip 3 by means of wire bonds 10b.

Figure 4:
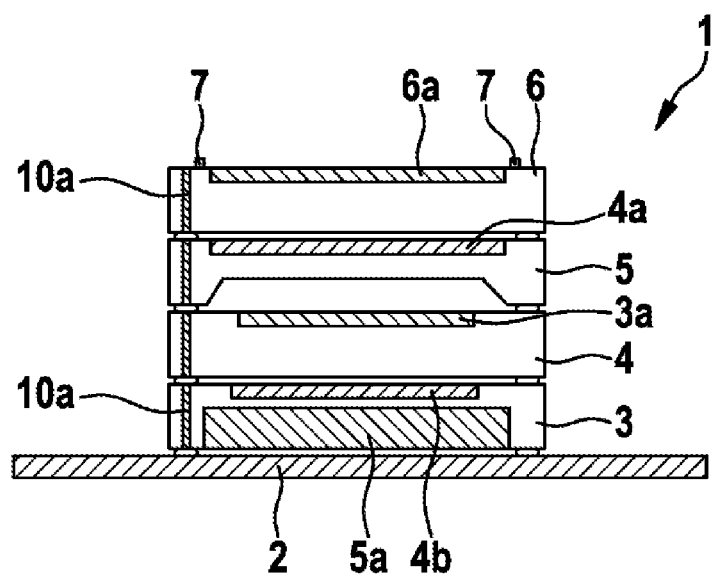
FIG. 4 shows in cross-section a microelectro-mechanical sensor module according to a fourth embodiment of the present disclosure.

FIG. 4 shows in cross-section a microelectromechanical sensor module according to a fourth embodiment of the present disclosure. In this case, the microelectromechanical sensor module 1 of FIG. 4 has the following construction from the bottom upwards: a chip 3 is arranged on a printed circuit board 2, which chip comprises a thin-film battery 5a on its lower face and an application specific integrated circuit 4b on its upper face. The chip 3 is connected by means of vias 10a on its left-hand side to the printed circuit board 2 and to a chip 4, which is arranged on the chip 3. The chip 4 here comprises sensing means 3a for measuring a pressure. The chip 4 is connected by means of vias 10a on its left-hand side to the underlying chip 3 and to a chip 5 arranged on said chip 4. The chip 5 comprises a wireless communications interface 4a. The chip 5 is connected by means of vias 10a to the underlying chip 4 and further to the chip 3 and the printed circuit board 2. The chip 5 is also connected by means of vias 10a on its left-hand side to a further chip 6, which is arranged on the chip 5. The chip 6 comprises here a solar cell 6a on its upper face. The chip 6 is connected by means of vias 10a on its left-hand side to the underlying chips 5, 4, 3 and the printed circuit board 2. An antenna 7, which is embodied in the form of vias 10a, is arranged at the edges of the solar cell 6a.

Figure 5:
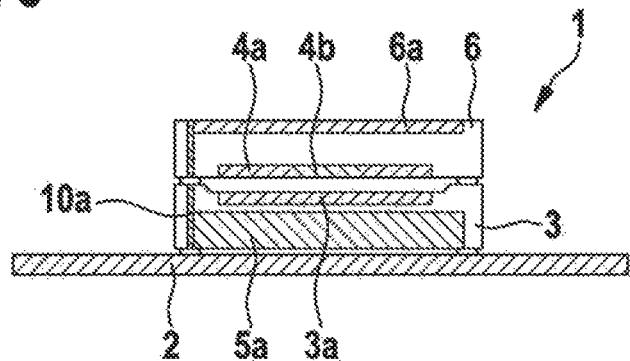
FIG. 5 shows in cross-section a microelectro-mechanical sensor module according to a fifth embodiment of the present disclosure.

FIG. 5 shows in cross-section a microelectromechanical sensor module according to a fifth embodiment of the present disclosure. The microelectromechanical sensor module 1 of FIG. 5 has the following construction from the bottom upwards: a chip 3 is arranged on the printed circuit board 2, which chip comprises a thin-film battery 5a on its lower face and on its upper face comprises sensing means 3a for measuring an acceleration. The chip 3 and thereby the thin-film battery 5a and the sensing means 3a are connected by means of vias 10a on the left-hand side of said chip to the printed circuit board 2, and also to a further chip 6, which is arranged on the chip 3. The chip 6 comprises on its lower face an application specific integrated circuit 4b and a wireless interface 4a. On its upper face, the chip 6 comprises a solar cell 6a. The chip 6 and thereby the application specific integrated circuit 4b, the wireless communications interface 4a and the solar cell 6a are connected in an electrically conducting manner by means of vias 10a on the left-hand side of the chip 6 to the underlying chip 3 and further to the printed circuit board 2. The microelectromechanical sensor module 1 shown in FIG. 5 has a high integration density by integrating at least two functions on respectively connected chips 3 and 6: thin-film battery 5a and sensing means 3a are arranged on a common chip 3, and likewise application specific integrated circuit 4b together with wireless interface 4a and solar cell 6a or energy harvester are arranged in a second chip 6.

Figure 6:
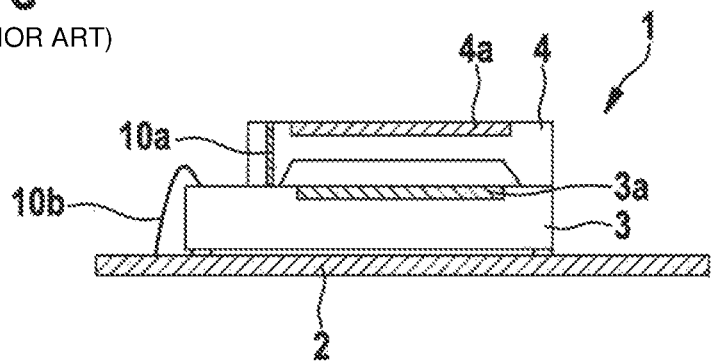
FIG. 6 shows in cross-section an already known sensor module.

FIG. 6 shows in cross-section an already known sensor module. In FIG. 6, reference sign 1 denotes a microelectromechanical sensor module 1. The microelectromechanical sensor module 1 here comprises a printed circuit board 2, on which is arranged a chip 3 comprising sensing means 3a. The chip 3 is here connected to the printed circuit board 2 by means of wire bonds 10b. On the upper face of the chip 3 is arranged a further chip 4, which comprises an application specific integrated circuit 4a. The chip 4 is connected to the chip 3 by means of vias 10a.

Although the present disclosure has been described above with reference to preferred exemplary embodiments, it is not limited to these embodiments but can be modified in numerous different ways.

The invention claimed is:

1. A microelectromechanical sensor module comprising:
   a sensing mechanism configured to measure one or more of an acceleration, a pressure, and an air humidity;
   a control mechanism configured to control the sensor module;
   a power supply mechanism configured to supply power to the sensor module; and
   a transmission mechanism configured to transmit signals from the sensing mechanism,
   wherein at least three of the mechanisms are integrated at the chip level with each of the at least three mechanisms in a respective chip, and
   wherein at least two of the mechanisms are arranged in a first chip of the respective chips.

2. The sensor module as claimed in claim 1, wherein all of the mechanisms are integrated at the chip level.

3. The sensor module as claimed in claim 1, wherein the power supply mechanism includes one or more of a battery and an environment energy converter.

4. The sensor module as claimed in claim 3, wherein the battery is a thin film battery and the environment energy converter is a solar cell.

5. The sensor module as claimed in claim 4, wherein the solar cell comprises a collector interconnection system configured as the transmission mechanism.

6. The sensor module as claimed in claim 5, wherein the collector interconnection system is configured as an antenna.

7. The sensor module as claimed in claim 1, wherein the transmission mechanism includes one or more of a radio frequency interface and an antenna.

8. The sensor module as claimed in claim 1, further comprising vias configured to make contact between the chips and/or between the chips and a printed circuit board.

9. The sensor module as claimed in claim 8, wherein the vias are arranged at the edge of the respective chip and at least some of the vias are designed as an antenna.

10. A method for producing a microelectromechanical sensor module, comprising:
    arranging a sensing mechanism on the sensor module, the sensing mechanism being configured to measure one or more an acceleration, a pressure, and an air humidity;
    arranging a control mechanism on the sensor module, the control mechanism being configured to control the sensing mechanism;
    arranging a power supply mechanism on the sensor module, the power supply mechanism being configured to supply power to the sensor module; and
    arranging a transmission mechanism on the sensor module, the transmission mechanism being configured to transmit signals from the sensing mechanism,
    wherein at least three of the mechanisms are arranged such that they are integrated at the chip level with each of the at least three mechanisms in a respective chip, and
    wherein at least two of the mechanisms are arranged in a first chip of the respective chips.

* * * * *